(12) United States Patent
Huang

(10) Patent No.: US 12,494,635 B2
(45) Date of Patent: Dec. 9, 2025

(54) ELECTRICAL DISCHARGE CIRCUIT

(71) Applicant: REALTEK SEMICONDUCTOR CORPORATION, Hsinchu (TW)

(72) Inventor: Chung-Yu Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 170 days.

(21) Appl. No.: 18/600,815

(22) Filed: Mar. 11, 2024

(65) Prior Publication Data
US 2025/0286366 A1 Sep. 11, 2025

(30) Foreign Application Priority Data

Mar. 24, 2023 (TW) .................. 112111207

(51) Int. Cl.
H02H 9/04 (2006.01)
H03K 17/082 (2006.01)

(52) U.S. Cl.
CPC ......... H02H 9/046 (2013.01); H03K 17/0822 (2013.01)

(58) Field of Classification Search
CPC ...................... H02H 9/046; H03K 17/0822
USPC .......................................................... 361/56
See application file for complete search history.

(56) References Cited

U.S. PATENT DOCUMENTS

| 7,742,265 | B2* | 6/2010 | Rice ..................... | H10D 89/811 361/56 |
|---|---|---|---|---|
| 10,177,137 | B1* | 1/2019 | Altolaguirre ........ | H10D 89/817 |
| 10,931,103 | B2* | 2/2021 | Chen ................... | H03K 17/0822 |
| 11,670,941 | B2* | 6/2023 | Chen ................... | H03K 17/0822 361/56 |
| 11,876,089 | B2* | 1/2024 | Chen ...................... | H02H 9/046 |
| 2009/0086391 | A1* | 4/2009 | Gauthier, Jr. ........ | H10D 89/819 361/56 |
| 2023/0138437 | A1* | 5/2023 | Wu ......................... | H02H 9/046 361/56 |
| 2023/0148160 | A1* | 5/2023 | Sivakumar ............. | H02H 9/046 361/56 |
| 2023/0170347 | A1* | 6/2023 | Huang ................... | H02M 7/539 361/56 |
| 2023/0327430 | A1* | 10/2023 | Xue ...................... | H02H 1/0007 |
| 2025/0132558 | A1* | 4/2025 | Chu ........................ | H02H 9/046 |
| 2025/0221054 | A1* | 7/2025 | Wen ..................... | H10D 89/711 |

* cited by examiner

Primary Examiner — Dharti H Patel
(74) Attorney, Agent, or Firm — WPAT, PC

(57) ABSTRACT

The present disclosure discloses an electrical discharge circuit. A voltage-dividing circuit performs voltage division on a voltage input terminal. A detection circuit generates a boosted detection signal. A first inverter is coupled to a first voltage feeding terminal and a second inverter input terminal. A second inverter is coupled to a first inverter output terminal and a ground terminal. A capacitor circuit of a RC circuit is coupled to the first voltage feeding terminal through a resistor to be charged to provide electric charges to the inverter input terminals. A first switch circuit is coupled to one of the inverter input terminals and the ground terminal. The boosted detection signal turns on and off the first and the second switch circuits respectively when an ESD input occurs such that a first and a second discharge transistors controlled by the inverter output terminals turn on to discharge the voltage input terminal.

10 Claims, 3 Drawing Sheets

ELECTRICAL DISCHARGE CIRCUIT

BACKGROUND OF THE INVENTION

1. Field of the Invention

The present disclosure relates to an electrical discharge circuit.

2. Description of Related Art

Electrostatic discharge (ESD) may cause permanent damage to electronic components and equipments such that the circuit function of the integrated circuit is affected. The products including the damaged components thus cannot operate properly.

ESD may occur during the manufacturing, packaging, testing, storing or moving of the chips. In order to recreate and prevent the occurrence of ESD, integrated circuit products may use ESD protection components or circuits to perform testing so as to enhance the protection ability against ESD and further increase the yield of the electronic products.

SUMMARY OF THE INVENTION

In consideration of the problem of the prior art, an object of the present disclosure is to provide an electrical discharge circuit.

The present invention discloses an electrical discharge circuit that includes a voltage-dividing circuit, a detection circuit, a first inverter, a second inverter, a resistor-capacitor (RC) circuit, a first switch circuit, a second switch circuit, a first discharge transistor and a second discharge transistor. The voltage-dividing circuit is electrically coupled to a voltage input terminal to generate a detection signal at a voltage-dividing terminal, wherein the voltage input terminal is electrically coupled to a first voltage feeding terminal that has a first voltage feeding thereto. The detection circuit is configured to operate according to a second voltage smaller than the first voltage to perform voltage-boost on the detection signal to generate a boosted detection signal. The first inverter has a first inverter input terminal and a first inverter output terminal and is electrically coupled between the first voltage feeding terminal and a second inverter input terminal. The second inverter has the second inverter input terminal and a second inverter output terminal and is electrically coupled between the first inverter output terminal and a ground terminal. The RC circuit includes a resistor and a capacitor circuit, wherein the capacitor circuit is coupled to the first voltage feeding terminal through the resistor to be charged therethrough so as to provide electric charges to the first inverter input terminal and the second inverter input terminal. The first switch circuit is electrically coupled between the ground terminal and one of the first inverter input terminal and second inverter input terminal. The second switch circuit is electrically coupled between a second voltage feeding terminal that has a second voltage feeding thereto and the second inverter input terminal. The first discharge transistor and the second discharge transistor are electrically coupled in series between the first voltage feeding terminal and the ground terminal, wherein the first discharge transistor is controlled by a first voltage of the first inverter output terminal and the second discharge transistor is controlled by a second voltage of the second inverter output terminal. When an ESD input occurs at the voltage input terminal, the boosted detection signal turns on the first switch circuit and turns off the second switch circuit such that the first discharge transistor and the second discharge transistor are turned on to discharge the voltage input terminal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an electrical discharge circuit to use the voltage-dividing circuit and the detection circuit to directly detect the voltage variation caused by the ESD input without being limited by the RC circuit in conventional designs. The electrical discharge circuit responses quickly and maintains a long-enough discharging time to keep the discharging activity of the discharging transistor stable. Moreover, the electrical discharge circuit makes sure the cross voltage of each of the components does not exceed a largest withstand voltage by using the internal configuration thereof.

Figure 1:
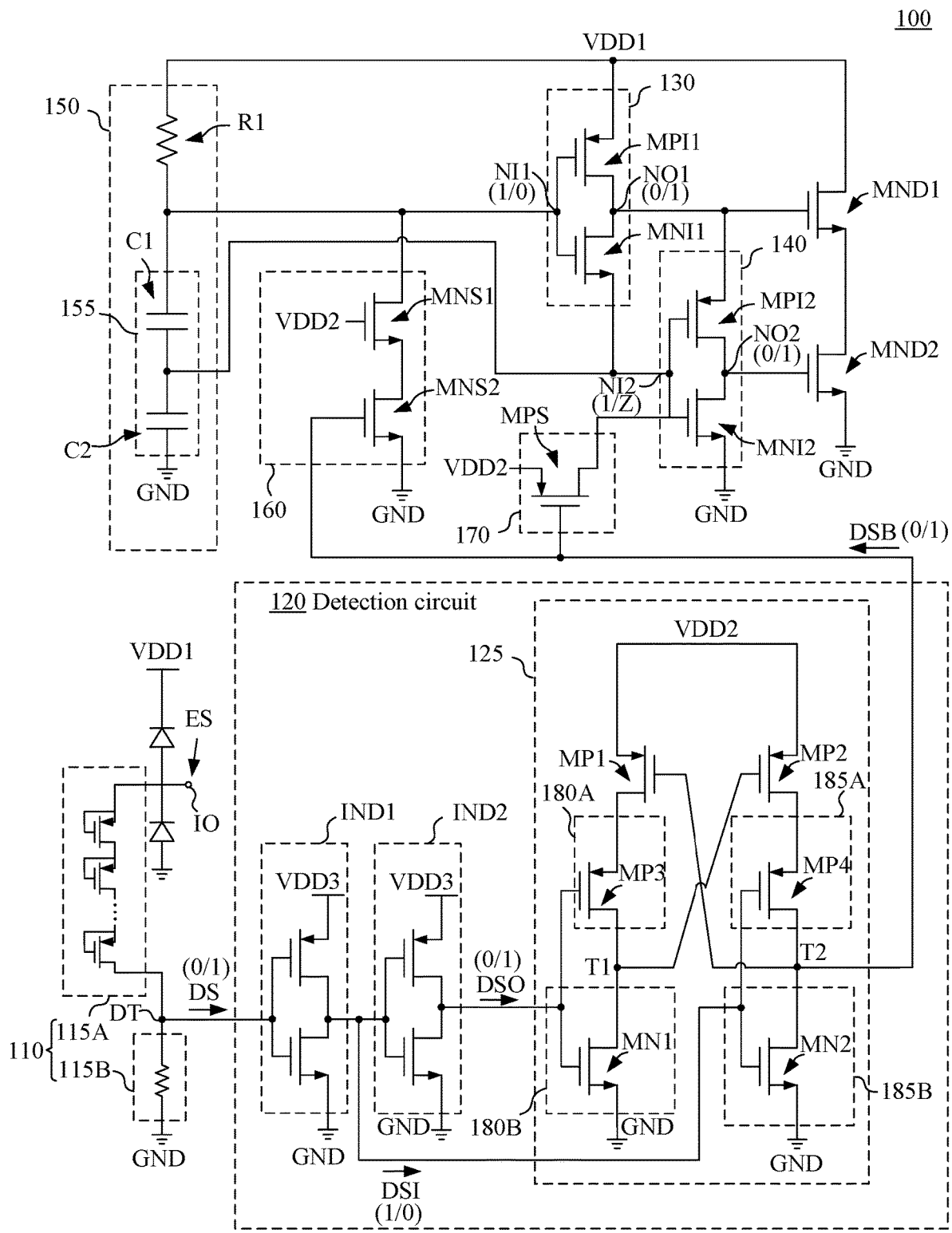
FIG. 1 illustrates a circuit diagram of an electrical discharge circuit according to an embodiment of the present invention.

Reference is now made to FIG. 1. FIG. 1 illustrates a circuit diagram of an electrical discharge circuit 100 according to an embodiment of the present invention. The electrical discharge circuit 100 comprises a voltage-dividing circuit 110, a detection circuit 120, a first inverter 130, a second inverter 140, a RC circuit 150, a first switch circuit 160, a second switch circuit 170, a first discharge transistor MND1 and a second discharge transistor MND2.

The voltage-dividing circuit 110 is electrically coupled to a voltage input terminal IO to generate a detection signal DS at a voltage-dividing terminal DT. The voltage input terminal IO can be a power pin that receives or transmits a power signal, or an I/O pin that receives or transmits a data signal. In an embodiment, the voltage input terminal IO may include one pin or more than one pins coupled in parallel.

In an embodiment, the voltage input terminal IO is further electrically coupled to a first voltage feeding terminal that has a first voltage VDD1 feeding thereto. In an embodiment, the first voltage VDD1 can be such as, but not limited to 3.3 volts.

In an embodiment, the voltage-dividing circuit 110 includes a first resistive circuit 115A and a second resistive circuit 115B electrically coupled in series between the voltage input terminal IO and a ground terminal GND through the voltage-dividing terminal DT.

The first resistive circuit 115A includes a resistor, a diode, a diode-connected transistor or a combination thereof. The amount of the components described above can be one or more than one, in which the components can be electrically coupled in series when the amount thereof is more than one. In FIG. 1, a plurality of diode-connected P-type transistors are exemplarily illustrated to be included in the first resistive circuit 115A. A single resistor is exemplarily illustrated to be included in the second resistive circuit 115B. In other embodiments, other components described above, diode-connected N-type transistors, a voltage dividing circuit having only resistors or other combinations of these components can be used to implement the resistive circuits. The present invention is not limited thereto.

In an embodiment, the electrical discharge circuit 100 is disposed in an electronic apparatus (not illustrated) and receives a power signal or a data signal through the voltage input terminal IO during the operation of such an electronic apparatus. The detection signal DS is therefore generated at the voltage-dividing terminal DT according to a resistance ratio between the first resistive circuit 115A and the second resistive circuit 115B.

The detection circuit 120 is configured to operate according to a second voltage VDD2 smaller than the first voltage VDD1 to perform voltage-boost on the detection signal DS to generate a boosted the detection signal DSB. In an embodiment, the second voltage VDD2 is such as, but not limited to 1.8 volts, and is generated by dividing the first voltage VDD1 or from an independent voltage source.

In an embodiment, the detection circuit 120 includes a first detection inverter IND1, a second detection inverter IND2 and a voltage-boost circuit 125.

The first detection inverter IND1 is configured to receive and invert the detection signal DS to generate an inverted the detection signal DSI. The second detection inverter IND2 is configured to receive and invert the inverted the detection signal DSI to generate an output the detection signal DSO.

In an embodiment, the first detection inverter IND1 and the second detection inverter IND2 operate according to the third voltage feeding terminal having a third voltage VDD3 feeding thereto. The third voltage VDD3 is such as, but not limited to 0.9 volts or 1.2 volts, and is generated by dividing the first voltage VDD1 or from an independent voltage source.

The voltage-boost circuit 125 is configured to generate the boosted the detection signal DSB according to the inverted the detection signal DSI and the output the detection signal DSO. In an embodiment, the voltage-boost circuit 125 includes a first P-type transistor MP1, a second P-type transistor MP2, a first P-type transistor circuit 180A, a first N-type transistor circuit 180B, a second P-type transistor circuit 185A and a second N-type transistor circuit 185B.

The first P-type transistor MP1 has a first P-type transistor control terminal and the second P-type transistor MP2 has a second P-type transistor control terminal.

The first P-type transistor circuit 180A and the first N-type transistor circuit 180B are electrically coupled in series between the first P-type transistor MP1 and the ground terminal GND through a first terminal T1 and are electrically coupled to a second voltage feeding terminal through the first P-type transistor MP1. Each of the first P-type transistor circuit 180A and the first N-type transistor circuit 180B includes a first control terminal configured to receive the output the detection signal DSO.

The second P-type transistor circuit 185A and the second N-type transistor circuit 185B are electrically coupled in series between the second P-type transistor MP2 and the ground terminal GND through a second terminal T2 and are electrically coupled to the second voltage feeding terminal through the second P-type transistor MP2. Each of the second P-type transistor circuit 185A and the second N-type transistor circuit 185B includes a second control terminal configured to receive the inverted the detection signal DSI.

The control terminal of the first P-type transistor MP1 is electrically coupled to the second terminal T2. The control terminal of the second P-type transistor MP2 is electrically coupled to the first terminal T1. The second terminal T2 is configured to generate the boosted the detection signal DSB. In an embodiment, the second terminal T2 is selectively electrically coupled to other circuits through an additional buffer (not illustrated in the figure) to amplify the boosted the detection signal DSB by using the buffer.

In the embodiment in FIG. 1, the first P-type transistor circuit 180A includes a P-type transistor MP3 and the first N-type transistor circuit 180B includes an N-type transistor MN1. The second P-type transistor circuit 185A includes a P-type transistor MP4 and the second N-type transistor circuit 185B includes an N-type transistor MN2.

More specifically, the source of the P-type transistor MP1 is electrically coupled to the second voltage feeding terminal. The drain of the P-type transistor MP1 is electrically coupled to the source of the P-type transistor MP3. The gate of the P-type transistor MP1 serves as the control terminal of the first P-type transistor MP1 and is electrically coupled to the second terminal T2. The source of the P-type transistor MP2 is electrically coupled to the second voltage feeding terminal. The drain of the P-type transistor MP2 is electrically coupled to the source of the P-type transistor MP4. The gate of the P-type transistor MP2 serves as the control terminal of the second P-type transistor MP2 and is electrically coupled to the first terminal T1.

The drain of the P-type transistor MP3 is electrically coupled to the drain of the N-type transistor MN1. The source of the N-type transistor MN1 is electrically coupled to the ground terminal. Each of the gate of the P-type transistor MP3 and the N-type transistor MN1 serves as the first control terminal to receive the output the detection signal DSO.

The drain of the P-type transistor MP4 is electrically coupled to the drain of the N-type transistor MN2. The source of the N-type transistor MN2 is electrically coupled to the ground terminal. Each of the gates of the P-type transistor MP4 and N-type transistor MN2 serves as the second control terminal to receive the inverted the detection signal DSI.

It is appreciated that each of the P-type transistor circuit and the N-type transistor circuit may include different amounts of transistors electrically coupled in series. The present invention is not limited to the configuration described above.

The first inverter 130 includes a first inverter input terminal NI1 and a first inverter output terminal NO1. The second inverter 140 includes a second inverter input terminal NI2 and a second inverter output terminal NO2.

The first inverter 130 is electrically coupled between the second inverter input terminal NI2 and the first voltage feeding terminal that has the first voltage VDD1 feeding thereto. The first inverter 130 includes a P-type transistor MPI1 and an N-type transistor MNI1 electrically coupled in series. The second inverter 140 is electrically coupled between the first inverter output terminal NO1 and the ground terminal GND. The second inverter 140 includes a P-type transistor MPI2 and an N-type transistor MNI2 electrically coupled in series.

The RC circuit 150 includes a resistor R1 and a capacitor circuit 155. The capacitor circuit 155 is electrically coupled to the first voltage feeding terminal through the resistor R1 to be charged therethrough so as to provide electric charges to the first inverter input terminal NI1 and the second inverter input terminal NI2.

In the present embodiment, the resistor R1 is electrically coupled between the first voltage feeding terminal and the first inverter input terminal NI1. The capacitor circuit 155 includes two capacitors C1 and C2 electrically coupled in series, wherein the capacitor C1 is electrically coupled between the first inverter input terminal NI1 and the second inverter input terminal NI2 and the capacitor C2 is electrically coupled between the second inverter input terminal NI2 and the ground terminal GND.

The first switch circuit 160 is electrically coupled between the first inverter input terminal NI1 and the ground terminal GND. In an embodiment, the first switch circuit 160 includes a first N-type switch transistor MNS1 and a second N-type switch transistor MNS2 electrically coupled in series. The first N-type switch transistor MNS1 is controlled to be turned on according to the second voltage VDD2. The second N-type switch transistor MNS2 is controlled to be turned on according the boosted the detection signal DSB.

The second switch circuit 170 is electrically coupled between the second inverter input terminal NI2 and the second voltage feeding terminal that has the second voltage VDD2 feeding thereto. In an embodiment, the second switch circuit 170 includes a P-type switch transistor MPS and is controlled by the boosted the detection signal DSB.

The first discharge transistor MND1 and the second discharge transistor MND2 are electrically coupled in series between the ground terminal GND and the first voltage feeding terminal that has the first voltage VDD1 feeding thereto. The first discharge transistor MND1 and the second discharge transistor MND2 turn on to discharge the voltage input terminal IO that is electrically coupled to the first voltage feeding terminal. The first discharge transistor MND1 is controlled by a voltage of the first inverter output terminal NO1. The second discharge transistor MND2 is controlled by a voltage of the second inverter output terminal NO2.

In the present embodiment, each of the first discharge transistor MND1 and the second discharge transistor MND2 is an N-type transistor. In other embodiments, the electrical discharge circuit 100 may dispose another inverter at the control terminal of each of the first discharge transistor MND1 and the second discharge transistor MND2 such that each of the first discharge transistor MND1 and the second discharge transistor MND2 is a P-type transistor. The present invention is not limited thereto.

The normal operation mode and the discharging mode of the electrical discharge circuit 100 performed according to different voltage amounts of the voltage input terminal IO are described in the following paragraphs. In FIG. 1, logic levels of the voltages of each of the signals and circuit nodes under the normal operation mode and the discharging mode are labeled, in which "1" stands for the high state level and "0" stands for the low state level.

When the voltage amount of the voltage input terminal IO does not exceed a predetermined level, e.g., only the power signal or the data signal is received at the voltage input terminal IO without receiving the ESD input ES generated from the actual electrostatics or caused by an electrical over shoot (EOS), the electrical discharge circuit 100 operates in the normal operation mode. Under such a condition, the detection signal DS generated by the voltage-dividing circuit 110 at the voltage-dividing terminal DT is at the low state level (0). The inverted the detection signal DSI is at the high state level (1) due to the operation of the first detection inverter IND1. The output the detection signal DSO is at the low state level (0) due to the operation of the second detection inverter IND2.

According to the inverted the detection signal DSI at the high state level, the P-type transistor MP4 turns off and the N-type transistor MN2 turns on. The voltage of the second terminal T2 is pulled low by the N-type transistor MN2. According to the output the detection signal DSO at the low state level, the P-type transistor MP3 turns on and the N-type transistor MN1 turns off. The voltage of the second terminal T2 turns on the P-type transistor MP1 to charge the first terminal T1, such that the voltage of the first terminal T1 increases to turn off the P-type transistor MP2. The boosted the detection signal DSB is at the low state level (0) since the voltage of the second terminal T2 is pulled low.

The first switch circuit 160 turns off due to the boosted the detection signal DSB such that the first inverter input terminal NI1 is at the high state level (1) of 3.3 volts since the first voltage VDD1 charges the capacitor circuit 155 of the RC circuit 150.

The second switch circuit 170 turns on due to the boosted the detection signal DSB and charges the second inverter input terminal NI2 according to the second voltage VDD2 such that the second inverter input terminal NI2 is at 1.8 volts. The second inverter input terminal NI2 having the voltage of 1.8 volts transmitted to the source of the N-type transistor MNI2 turns on the N-type transistor MNI2. As a result, such a voltage of 1.8 volts is equivalent to the high state level (1).

The high state level of the first inverter input terminal NI1 turns off the P-type transistor MPI1 and turns on the N-type transistor MNI1 of the first inverter 130. The first inverter output terminal NO1 is at the low state level (0) in general accordingly. Since the N-type transistor MNI1 is electrically coupled to the second inverter input terminal NI2, the first inverter output terminal NO1 is logically at a low state (based on the condition of the logic operation performed by the first inverter 130 that receives the high state level at the first inverter input terminal NI1). However, the actual voltage amount of the first inverter output terminal NO1 is 1.8 volts since the first inverter output terminal NO1 and the second inverter input terminal NI2 are electrically coupled based on the condition that the N-type transistor MNI1 turns on.

The high state level of the second inverter input terminal NI2 turns off the P-type transistor MPI2 and turns on the N-type transistor MNI2 of the second inverter 140. The second inverter output terminal NO2 is at the low state level (0) accordingly.

Based on the first voltage VDD1 that is 3.3 volts and the first inverter output terminal NO1 at the low state level of 1.8 volts, the first discharge transistor MND1 turns off. According to the second inverter output terminal NO2 at the low state level, the second discharge transistor MND2 turns off.

On the other hand, when the voltage amount of the voltage input terminal IO exceeds the predetermined level, e.g., not only the power signal or the data signal is received but also the ESD input ES having an instantly large voltage is received at the voltage input terminal IO, the electrical discharge circuit 100 operates in the discharging mode. Under such a condition, the detection signal DS generated by the voltage-dividing circuit 110 at the voltage-dividing terminal DT is at the high state level (1). The inverted the detection signal DSI is at the low state level (0) due to the operation of the first detection inverter IND1. The output the detection signal DSO is at the high state level (1) due to the operation of the second detection inverter IND2.

According to the output the detection signal DSO at the high state level, the P-type transistor MP3 turns off and the N-type transistor MN1 turns on. The voltage of the first terminal T1 is pulled low by the N-type transistor MN1. According to the inverted the detection signal DSI at the low state level, the P-type transistor MP4 turns off and the N-type transistor MN2 turns on. The voltage of the first terminal T1 turns on P-type transistor MP2 to charge the second terminal T2 such that the voltage of the second terminal T2 increases to turn off the P-type transistor MP1 turns off. The boosted the detection signal DSB is at the high state level (1) since the voltage of the second terminal T2 is pulled high.

The first switch circuit 160 turns on due to the boosted the detection signal DSB to pull low the first inverter input terminal NI1 such that the first inverter input terminal NI1 is at the low state level (0).

The second switch circuit 170 turns off due to the boosted the detection signal DSB such that the second inverter input terminal NI2 is floating (labeled by the symbol "Z").

The low state level of the first inverter input terminal NI1 turns on the P-type transistor MPI1 and turns off the N-type transistor MNI1 of the first inverter 130. The first inverter output terminal NO1 is at the high state level (1) of 3.3 volts accordingly.

The floating state of the second inverter input terminal NI2 is below the high state level of the first inverter output terminal NO1 such that both the P-type transistor MPI2 and the N-type transistor MNI2 of the second inverter 140 turn on. Under such a condition, the second inverter output terminal NO2 is at the high state level (1) that is slightly below 3.3 volts.

According to the first inverter output terminal NO1 having the 3.3 volts high state level, the first discharge transistor MND1 turns on. According to the second inverter output terminal NO2 having the high state level, the second discharge transistor MND2 turns on.

As a result, the boosted the detection signal DSB only turns on the first switch circuit 160 and turns off the second switch circuit 170 when the ESD input ES occurs such that the first discharge transistor MND1 and the second discharge transistor MND2 both turn on to discharge the voltage input terminal IO.

It is appreciated that after the first discharge transistor MND1 and the second discharge transistor MND2 discharge the voltage input terminal IO for a certain time period and makes the voltage of the voltage input terminal IO drops to further make the detection signal DS generated by dividing the voltage of the voltage input terminal IO go back to the low state level (0), the electrical discharge circuit 100 operates the normal operation mode again.

In an embodiment, the internal components (e.g., transistors) of the first detection inverter IND1 and the second detection inverter IND2 are low voltage (LV) devices or underdrive (UD) devices that operate according to 0.9 volts (the first voltage) and have a relative lower turn-on voltage. The internal components (e.g., transistors) of other circuits included in the electrical discharge circuit 100 have a relative higher threshold voltage but are high voltage (HV) devices that only can withstand a voltage up to 1.8 volts (the second voltage) instead of the HV devices that can withstand a voltage up to 3.3 volts (the first voltage).

Due to the lower turn-on voltage, the first detection inverter IND1 and the second detection inverter IND2 has a response speed higher than the other internal components in the other circuits. The sensitivity of the detection can be increased. Besides, by using the other circuit configurations in the electrical discharge circuit 100, each of the components therein can avoid the condition that the cross voltage between any two of the terminals thereof exceeding the largest withstanding voltage (e.g., 1.8 volts). The device reliability can thereof be increased.

In some approaches, the electrical discharge circuit only uses a RC circuit to be coupled to the voltage input terminal to further control the inverter that determines whether the discharging transistors are activated. The disposition of the RC circuit determines whether the discharging mechanism is activated according to the frequency of the ESD input. When the occurrence of the ESD input is not long enough or the energy of the ESD input is not large enough, the RC circuit that is fully charged makes the inverter response slowly. Not only the discharging mechanism is activated slowly, but also the discharging mechanism does not last long enough. Further, under such a condition, the discharging transistors require breakdown mechanism to operate, in which the breakdown mechanism results in an uneven turn-on of the transistors.

The electrical discharge circuit of the present invention uses the voltage-dividing circuit and the detection circuit to directly detect the voltage variation caused by the ESD input without being limited by the RC circuit in conventional designs. The electrical discharge circuit responses quickly and maintains a long-enough discharging time to keep the discharging activity of the discharging transistor stable. Moreover, the electrical discharge circuit makes sure the cross voltage of each of the components does not exceed a largest withstand voltage by using the internal configuration thereof.

Figure 2:
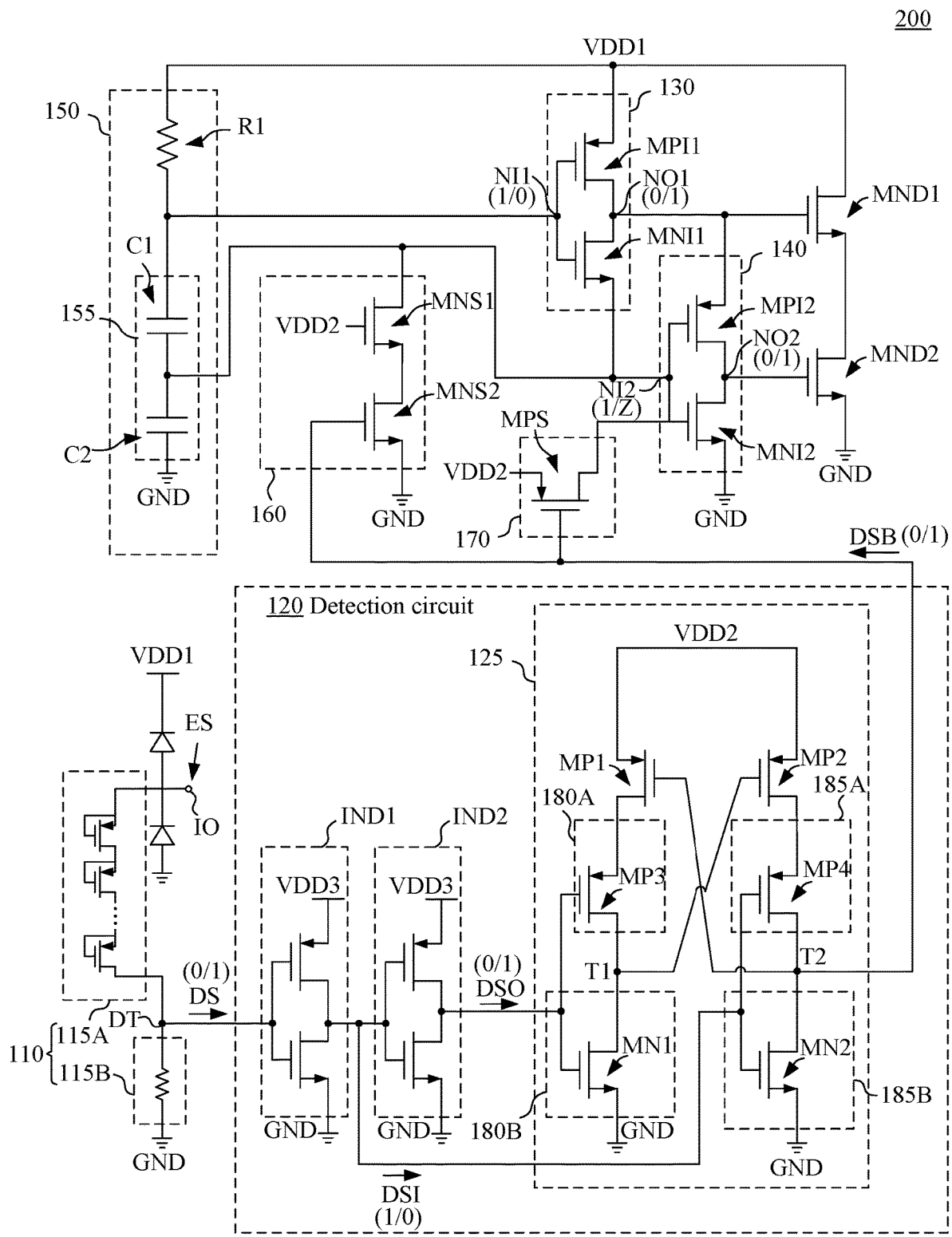
FIG. 2 illustrates a circuit diagram of an electrical discharge circuit according to an embodiment of the present invention.

Reference is now made to FIG. 2. FIG. 2 illustrates a circuit diagram of an electrical discharge circuit 200 according to an embodiment of the present invention.

The electrical discharge circuit 200 in FIG. 2 includes all the components in the electrical discharge circuit 100 in FIG. 1. The configuration and operation of these components are not described herein.

In the present embodiment, the first switch circuit 160 of the electrical discharge circuit 200 is electrically coupled between the second inverter input terminal NI2 and the ground terminal GND.

Under such a condition, when the ESD input ES is not presented such that the boosted the detection signal DSB is at the low state level, the first inverter input terminal NI1 and the second inverter input terminal NI2 are still at the high state level, and the first inverter 130 and the second inverter 140 respectively turn off the first discharge transistor MND1 and the second discharge transistor MND2 to operate in the same way as described in the previous embodiment. The detail is not described herein.

When the ESD input ES is presented such that the boosted the detection signal DSB is at the high state level, the first switch circuit 160 pulls low the voltage of the first inverter input terminal NI1 through the capacitor C1 and pulls low the voltage of the second inverter input terminal NI2 simultaneously. The first inverter 130 and the second inverter 140 further respectively turn on the first discharge transistor MND1 and the second discharge transistor MND2 to operate in the same way as described in the previous embodiment. The detail is not described herein.

Figure 3:
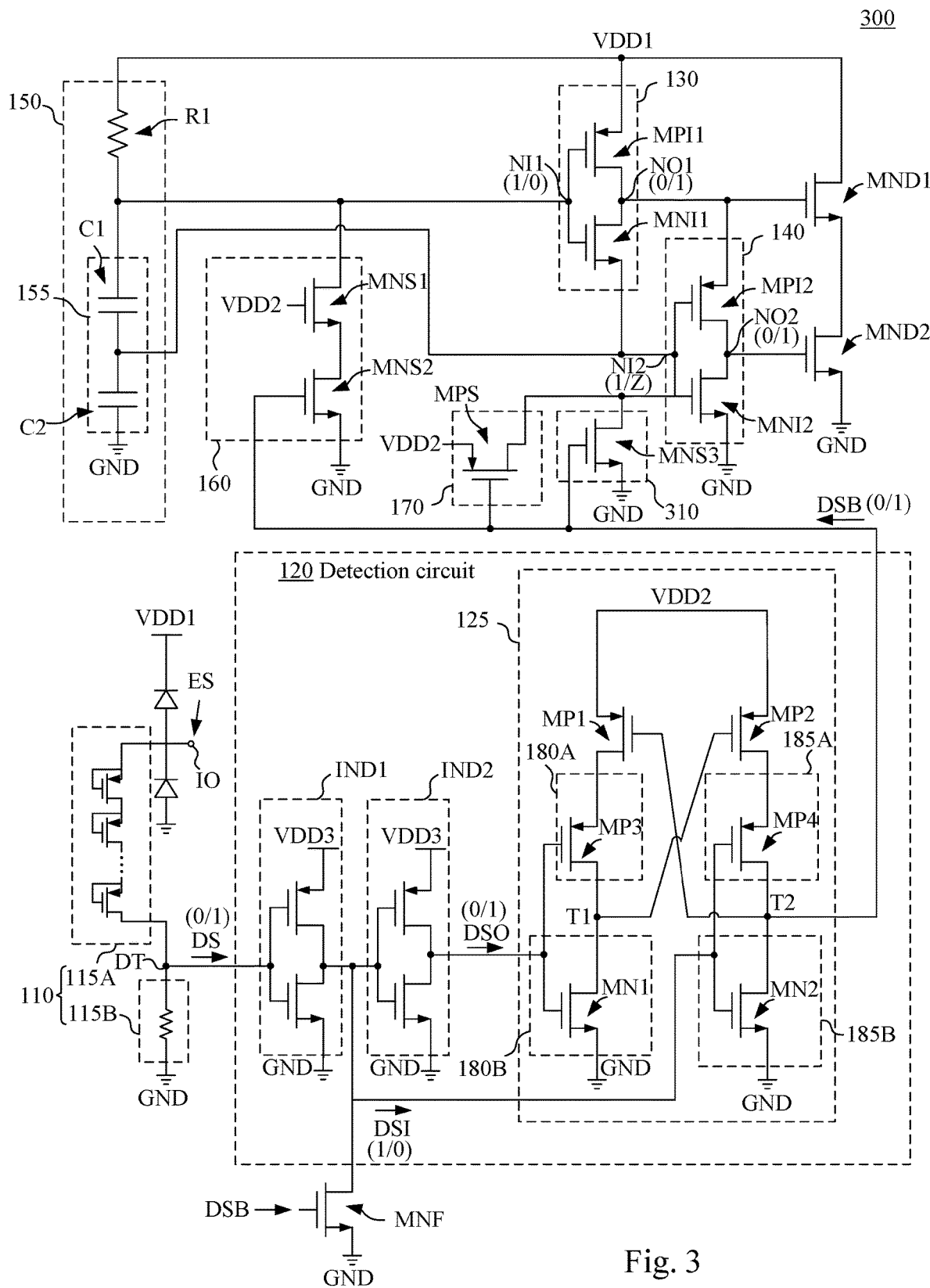
FIG. 3 illustrates a circuit diagram of an electrical discharge circuit according to an embodiment of the present invention.

Reference is now made to FIG. 3. FIG. 3 illustrates a circuit diagram of an electrical discharge circuit 300 according to an embodiment of the present invention.

The electrical discharge circuit 300 in FIG. 3 includes all the components in the electrical discharge circuit 100 in FIG. 1. The configuration and operation of these components are not described herein.

In the present embodiment, electrical discharge circuit 300 further includes a third switch circuit 310 and a feedback transistor.

The third switch circuit 310 is electrically coupled between the second inverter input terminal NI2 and the ground terminal GND. The third switch circuit 310 includes a third N-type switch transistor MNS3 and is controlled by the boosted the detection signal DSB.

When the ESD input ES is not presented such that the boosted the detection signal DSB is at the low state level, the third switch circuit 310 turns off without affecting the voltage of the second inverter input terminal NI2. The operation of the second inverter 140 is thus identical to what described in the previous embodiment and is not described herein.

When the ESD input ES is presented such that the boosted the detection signal DSB is at the high state level, the third switch circuit 310 turns on to pull low the voltage of the second inverter input terminal NI2 even quickly such that the first inverter 130 and the second inverter 140 respectively turn on the first discharge transistor MND1 and the second discharge transistor MND2 to operate in the same way as described in the previous embodiment. The detail is not described herein.

On the other hand, in the present embodiment, the feedback transistor is an N-type feedback transistor MNF electrically coupled between the ground terminal GND and the connection terminal between the first detection inverter IND1 and the second detection inverter IND2. The N-type feedback transistor MNF is controlled by the boosted the detection signal DSB to decrease the transition speed of the voltage-boost circuit 125.

More specifically, when the ESD input ES is not presented such that the boosted the detection signal DSB is at the low state level, the N-type feedback transistor MNF turns off according to the boosted the detection signal DSB. Under such a condition, the N-type feedback transistor MNF does not affect the operation of the voltage-boost circuit 125.

However, when the ESD input ES is presented such that the boosted the detection signal DSB is at the high state level, the N-type feedback transistor MNF turns on according to the boosted the detection signal DSB.

Under such a condition, even if the voltage of the voltage input terminal IO drops to the low state level due to the discharging of the first discharge transistor MND1 and the second discharge transistor MND2 to make the first detection inverter IND1 output the high state level at the connection terminal, the N-type feedback transistor MNF keeps pulling low the voltage level of the connection terminal since the N-type feedback transistor MNF turns on. The output the detection signal DSO is kept at the high state level. The voltage-boost circuit 125 keeps the boosted the detection signal DSB at the high state level to avoid the transition of the state of the boosted the detection signal DSB. The first discharge transistor MND1 and the second discharge transistor MND2 therefore keeps discharging for a longer time. As a result, the disposition of the N-type feedback transistor MNF avoids the severe discharging characteristic caused by the severe voltage-pulling of the third switch circuit 310.

In an embodiment, the N-type feedback transistor MNF can be controlled by the voltage of the second inverter output terminal NO2. Since the variation of the voltage level of the second inverter output terminal NO2 is the same as the variation of the boosted the detection signal DSB, the operation of the circuit components related thereto can be the same. The detail is not described herein.

However, it is appreciated that the third switch circuit 310 and the N-type feedback transistor MNF are not necessarily presented in the electrical discharge circuit simultaneously. The third switch circuit 310 and the N-type feedback transistor MNF can be disposed in the electrical discharge circuit independently according to practical requirements. The present invention is not limited thereto.

It is appreciated that the embodiments described above are merely an example. In other embodiments, it is appreciated that many modifications and changes may be made by those of ordinary skill in the art without departing, from the spirit of the invention.

In summary, the electrical discharge circuit uses the voltage-dividing circuit and the detection circuit to directly detect the voltage variation caused by the ESD input without being limited by the RC circuit in conventional designs. The electrical discharge circuit responses quickly and maintains a long-enough discharging time to keep the discharging activity of the discharging transistor stable. Moreover, the electrical discharge circuit makes sure the cross voltage of each of the components does not exceed a largest withstand voltage by using the internal configuration thereof.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An electrical discharge circuit, comprising:
a voltage-dividing circuit electrically coupled to a voltage input terminal to generate a detection signal at a voltage-dividing terminal, wherein the voltage input terminal is electrically coupled to a first voltage feeding terminal that has a first voltage feeding thereto;
a detection circuit configured to operate according to a second voltage smaller than the first voltage to perform voltage-boost on the detection signal to generate a boosted detection signal;
a first inverter having a first inverter input terminal and a first inverter output terminal and electrically coupled between the first voltage feeding terminal and a second inverter input terminal;
a second inverter having the second inverter input terminal and a second inverter output terminal and electrically coupled between the first inverter output terminal and a ground terminal;
a resistor-capacitor (RC) circuit comprising a resistor and a capacitor circuit, wherein the capacitor circuit is coupled to the first voltage feeding terminal through the resistor to be charged therethrough so as to provide electric charges to the first inverter input terminal and the second inverter input terminal;
a first switch circuit electrically coupled between the ground terminal and one of the first inverter input terminal and second inverter input terminal;
a second switch circuit electrically coupled between a second voltage feeding terminal that has a second voltage feeding thereto and the second inverter input terminal; and
a first discharge transistor and a second discharge transistor electrically coupled in series between the first voltage feeding terminal and the ground terminal, wherein the first discharge transistor is controlled by a first voltage of the first inverter output terminal, and the second discharge transistor is controlled by a second voltage of the second inverter output terminal;

wherein when an ESD input occurs at the voltage input terminal, the boosted detection signal turns on the first switch circuit and turns off the second switch circuit such that the first discharge transistor and the second discharge transistor are turned on to discharge the voltage input terminal.

2. The electrical discharge circuit of claim 1, wherein the detection circuit comprises:

a first detection inverter configured to receive and invert the detection signal to generate an inverted detection signal;

a second detection inverter configured to receive and invert the inverted detection signal to generate an output detection signal; and a voltage-boost circuit comprising:

a first P-type transistor and a second P-type transistor, wherein the first P-type transistor has a first P-type transistor control terminal, and the second P-type transistor has a second P-type transistor control terminal;

a first P-type transistor circuit and a first N-type transistor circuit electrically coupled in series between the first P-type transistor and the ground terminal through a first terminal and electrically coupled to the second voltage feeding terminal through the first P-type transistor electrically coupled to the second voltage feeding terminal, each of the first P-type transistor circuit and the first N-type transistor circuit has a first control terminal configured to receive the output detection signal; and a second P-type transistor circuit and a second N-type transistor circuit electrically coupled in series between the second P-type transistor and the ground terminal through a second terminal and electrically coupled to the second voltage feeding terminal through the second P-type transistor, each of the second P-type transistor circuit and the second N-type transistor circuit has a second control terminal configured to receive the inverted detection signal;

wherein the first P-type transistor control terminal is electrically coupled to the second terminal, the second P-type transistor control terminal is electrically coupled to the first terminal, and the second terminal is configured to generate the boosted detection signal.

3. The electrical discharge circuit of claim 2, wherein the first detection inverter and the second detection inverter operate according to a third voltage feeding terminal that has a third voltage feeding thereto, wherein the third voltage is smaller than the second voltage.

4. The electrical discharge circuit of claim 3, wherein the third voltage is generated by dividing the first voltage or from an independent voltage source.

5. The electrical discharge circuit of claim 2, further comprising a feedback transistor electrically coupled between the ground terminal and a connection terminal which is between the first detection inverter and the second detection inverter and controlled by the boosted detection signal or a voltage of the second inverter output terminal to decrease a transition speed of the voltage-boost circuit.

6. The electrical discharge circuit of claim 1, wherein the first switch circuit comprises a first N-type switch transistor and a second N-type switch transistor electrically coupled in series, wherein the first N-type switch transistor is controlled by the second voltage to be turned on, and the second N-type switch transistor is controlled by the boosted detection signal;

the second switch circuit comprises a P-type switch transistor and is controlled by the boosted detection signal.

7. The electrical discharge circuit of claim 1, further comprising a third switch circuit, electrically coupled between the second inverter input terminal and the ground terminal, wherein the third switch circuit comprises a third N-type switch transistor controlled by the boosted detection signal.

8. The electrical discharge circuit of claim 1, wherein under a normal operation mode that a voltage amount of the voltage input terminal does not exceed a predetermined level, the detection signal is at a low state level and the boosted detection signal is at the low state level such that the first switch circuit turns off to pull high a voltage of the first inverter input terminal and the second switch circuit turns on to pull high a voltage of the second inverter input terminal;

the first inverter further pulls a voltage of the first inverter output terminal to the second voltage to turn off the first discharge transistor, and the second inverter further pull a voltage of the second inverter output terminal to a ground voltage level to turn off the second discharge transistor.

9. The electrical discharge circuit of claim 1, wherein under a discharging mode that a voltage amount of the voltage input terminal exceeds a predetermined level due to the ESD input received at the voltage input terminal, the detection signal is at a high state level and the boosted detection signal is at the high state level such that the first switch circuit turns on to pull low a voltage of the first inverter input terminal and the second switch circuit turns off to keep the second inverter input terminal floating;

the first inverter further pulls a voltage of the first inverter output terminal to the first voltage to turn on the first discharge transistor, and the second inverter pulls a voltage of the second inverter output terminal to the first voltage to turn on the second discharge transistor.

10. The electrical discharge circuit of claim 1, wherein the voltage-dividing circuit comprises a first resistive circuit and a second resistive circuit electrically coupled in series between the voltage input terminal and the ground terminal through the voltage-dividing terminal.

* * * * *